US011600499B2

United States Patent
(12) United States Patent
Aibara

(10) Patent No.: US 11,600,499 B2
(45) Date of Patent: Mar. 7, 2023

(54) SUBSTRATE CLEANING METHOD, SUBSTRATE CLEANING SYSTEM, AND STORAGE MEDIUM

(71) Applicant: Tokyo Electron Limited, Tokyo (JP)

(72) Inventor: Meitoku Aibara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 55 days.

(21) Appl. No.: 17/255,029

(22) PCT Filed: Jun. 13, 2019

(86) PCT No.: PCT/JP2019/023391
§ 371 (c)(1),
(2) Date: Dec. 22, 2020

(87) PCT Pub. No.: WO2020/004047
PCT Pub. Date: Jan. 2, 2020

(65) Prior Publication Data

US 2021/0265180 A1 Aug. 26, 2021

(30) Foreign Application Priority Data

Jun. 27, 2018 (JP) ............................ JP2018-122318

(51) Int. Cl.
*H01L 21/67* (2006.01)
*H01L 21/02* (2006.01)

(52) U.S. Cl.
CPC .. *H01L 21/67051* (2013.01); *H01L 21/02054* (2013.01)

(58) Field of Classification Search
CPC ......... H01L 21/67051; H01L 21/02054; B08B 3/08; B08B 1/00
See application file for complete search history.

(56) References Cited

U.S. PATENT DOCUMENTS

| | | | | |
|---|---|---|---|---|
| 9,818,598 | B2 * | 11/2017 | Aibara | H01L 21/67051 |
| 2003/0154659 | A1 * | 8/2003 | Xu | C09G 1/02 438/692 |
| 2004/0084415 | A1 * | 5/2004 | Wang | H01L 21/3212 257/E21.583 |
| 2014/0144465 | A1 * | 5/2014 | Kaneko | H01L 21/67051 134/4 |

(Continued)

FOREIGN PATENT DOCUMENTS

| | | | |
|---|---|---|---|
| JP | 2015-119164 | A | 6/2015 |
| JP | 2016-36012 | A | 3/2016 |
| JP | 2016-201385 | A | 12/2016 |

*Primary Examiner* — Sharidan Carrillo
(74) *Attorney, Agent, or Firm* — Nath, Goldberg & Meyer; Jerald L. Meyer; Tanya E. Harkins

(57) ABSTRACT

A substrate cleaning method according to an aspect of the present disclosure includes: supplying a film-forming treatment liquid containing a volatile component to a substrate to form a film on the substrate; supplying a peeling treatment liquid, which peels off a treatment film from the substrate, to the treatment film formed by solidifying or curing the film-forming treatment liquid on the substrate due to volatilization of the volatile component; and supplying a hydrophobic liquid, which hydrophobizes the substrate, to the substrate to which the peeling treatment liquid has been supplied.

8 Claims, 10 Drawing Sheets

Start
Loading process ~S101
Film-forming process ~S102
First drying process ~S103
peeling process ~S104
Dissolving process ~S105
Hydrophobizing process ~S106
Rinsing process ~S107
Second drying process ~S108
Unloading process ~S109
End

(56) References Cited

U.S. PATENT DOCUMENTS

| | | | | |
|---|---|---|---|---|
| 2015/0371845 | A1* | 12/2015 | Koide | H01L 21/324 438/694 |
| 2016/0172433 | A1* | 6/2016 | Cho | H01L 28/60 438/381 |
| 2016/0289455 | A1* | 10/2016 | Inaoka | C11D 3/36 |
| 2021/0265180 | A1* | 8/2021 | Aibara | H01L 21/6715 |

* cited by examiner

S104
L2
F
P
W
S105
L3
P
W
S106
L4
H
P
W
S107
L5
H
P
W
S108
P
W

S104
L2
F
P
W
S106
L4a
P
W
L4a
L4b
P
W
L4
H
P
W
S107
L5
H
P
W
S108
P
W

SUBSTRATE CLEANING METHOD, SUBSTRATE CLEANING SYSTEM, AND STORAGE MEDIUM

This is a National Phase Application filed under 35 U.S.C. 371 as a national stage of PCT/JP2019/023391, filed Jun. 13, 2019, an application claiming the benefit of Japanese Application No. 2018-122318, filed Jun. 27, 2018, the content of each of which is hereby incorporated by reference in its entirety.

TECHNICAL FIELD

The present disclosure relates to a substrate cleaning method, a substrate cleaning system, and a storage medium.

BACKGROUND

A technique for removing particles adhering to a substrate such as a silicon wafer, a compound semiconductor wafer, or the like has been conventionally known.

For example, Patent Document 1 discloses a substrate cleaning method which includes forming a treatment film on a surface of a substrate, and peeling off the treatment film in the form of a "film" to remove particles on the substrate together with the treatment film.

PRIOR ART DOCUMENTS

Patent Documents

Patent Document 1: Japanese laid-open publication No. 2015-119164

SUMMARY

The present disclosure provides some embodiments of a technique which is capable of suppressing pattern collapse during a process of drying a substrate, in which a treatment film is formed on a surface of the substrate and is peeled off in the form of a "film" to remove particles on the substrate together with the treatment film.

According to one aspect of the present disclosure, a substrate cleaning method includes: supplying a film-forming treatment liquid containing a volatile component to a substrate to form a film on the substrate; supplying a peeling treatment liquid, which peels off a treatment film from the substrate, to the treatment film formed by solidifying or curing the film-forming treatment liquid on the substrate due to volatilization of the volatile component; and supplying a hydrophobic liquid, which hydrophobizes the substrate, to the substrate to which the peeling treatment liquid has been supplied.

According to the present disclosure, it is possible to suppress pattern collapse during a process of drying a substrate in a technique in which a treatment film is formed on a surface of the substrate and is peeled off in the form of a "film" to remove particles on the substrate together with the treatment film.

DETAILED DESCRIPTION

Figure 1A:
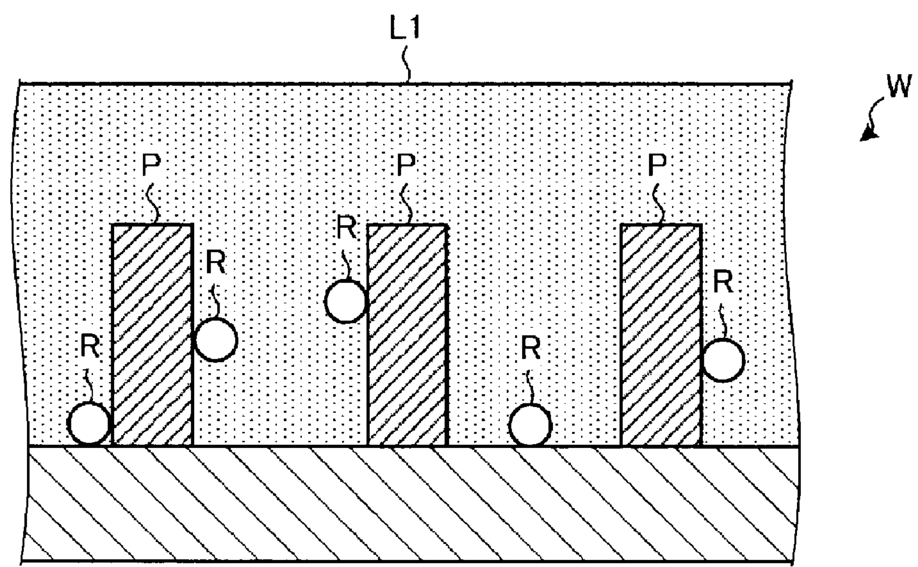
FIG. 1A is an explanatory view of a substrate cleaning method according to a first embodiment.

Modes for implementing a substrate cleaning method, a substrate cleaning system, and a storage medium according to the present disclosure (hereinafter referred to as "embodiments") will now be described in detail with reference to the drawings. It should be noted that these embodiments do not limit the substrate cleaning method, the substrate cleaning system, and the storage medium according to the present disclosure. In addition, the embodiments may be properly combined unless a conflict arises in the processing contents. Further, in the following embodiments, the same parts will be denoted by the same reference numerals, and explanation thereof will be omitted.

As a technique for removing particles adhering to a substrate, there is known a technique which includes forming a treatment film on a surface of the substrate, and peeling off the treatment film in the form of a "film" to remove particles on the substrate together with the treatment film.

In recent years, with the miniaturization of patterns formed on a substrate, for example, the aspect ratio of a trench in a trench element isolation structure and a space in a line-space-pattern tend to increase. The increase in the aspect ratio may cause pattern collapse due to the surface tension of a process liquid remaining between patterns during a process of drying the substrate. Therefore, there is a need to provide a technique capable of suppressing a pattern collapse during a process of drying a substrate.

First Embodiment

[Outline of Substrate Cleaning Method]

First, an outline of a substrate cleaning method according to a first embodiment will be described with reference to FIGS. 1A to 1E. FIGS. 1A to 1E are explanatory views of the substrate cleaning method according to the first embodiment.

As illustrated in FIG. 1A, the substrate cleaning method according to the first embodiment removes particles R adhering to a pattern P on a substrate such as a silicon wafer or a compound semiconductor wafer (hereinafter referred to as a "wafer W") or a formation surface of the pattern P.

The substrate processing method according to the first embodiment includes supplying a treatment liquid containing a volatile component and serving to form a film on the wafer W (hereinafter referred to as a "film-forming treatment liquid L1") to the formation surface of the pattern P (hereinafter referred to as a "pattern formation surface") on the wafer W.

Here, the pattern formation surface of the wafer W has hydrophilicity, for example, by being covered with a hydrophilic film (not shown) or by being subjected to a hydrophilic treatment using ozone water or the like.

Figure 1B:
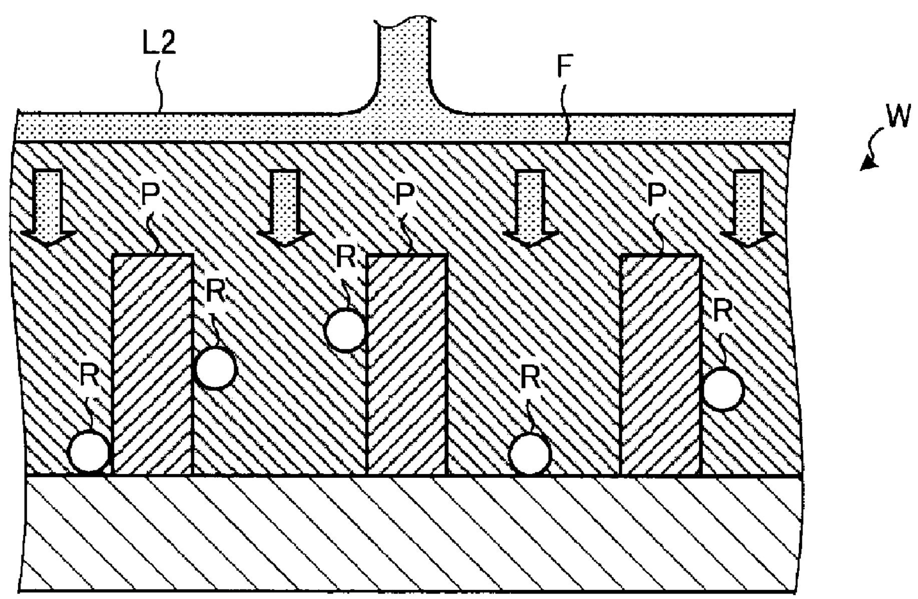
FIG. 1B is an explanatory view of the substrate cleaning method according to the first embodiment.
Figure 1C:
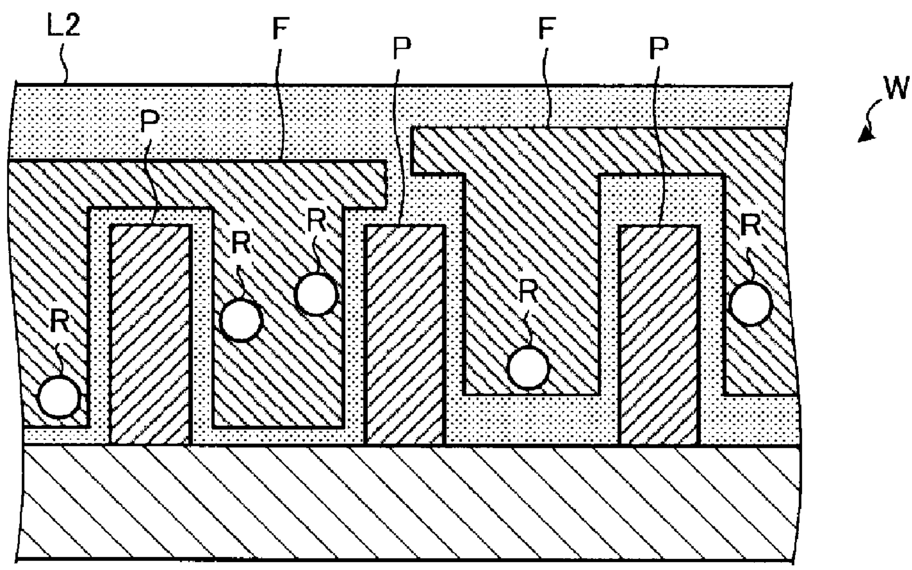
FIG. 1C is an explanatory view of the substrate cleaning method according to the first embodiment.

The film-forming treatment liquid L1 supplied to the pattern formation surface of the wafer W solidifies or cures while causing volume shrinkage due to volatilization of the volatile component to become a treatment film F (see FIG. 1B). As a result, the pattern P formed on the wafer W and the particles R adhering to the pattern P are covered with the treatment film F. In addition, the term "solidification" referred to herein means making something solid, and the term "curing" referred to herein means that molecules are linked to each other to form a polymer (for example, cross-linking, polymerization, etc.).

Subsequently, as illustrated in FIG. 1B, a peeling treatment liquid L2 is supplied to the treatment film F on the wafer W. The peeling treatment liquid L2 is a liquid that peels the treatment film F off the wafer W.

Specifically, the peeling treatment liquid L2 is a hydrophilic treatment liquid. After being supplied on the treatment film F, the peeling treatment liquid L2 permeates into the treatment film F and reaches an interface of the wafer W. Since the pattern formation surface, which is the interface of the wafer W, has hydrophilicity, the peeling treatment liquid L2 that has reached the pattern formation surface permeates to the pattern formation surface.

When the peeling treatment liquid L2 penetrates between the wafer W and the treatment film F, the treatment film F is peeled off from the wafer W in the form of a "film". Accordingly, the particles R adhering to the pattern formation surface are peeled off from the wafer W together with the treatment film F (see FIG. 1C).

Further, the film-forming treatment liquid L1 can separate the particles R adhering to the pattern P or the like from the pattern P or the like due to a strain (tensile force) caused by the volume shrinkage involved in the volatilization of the volatile component.

Figure 1D:
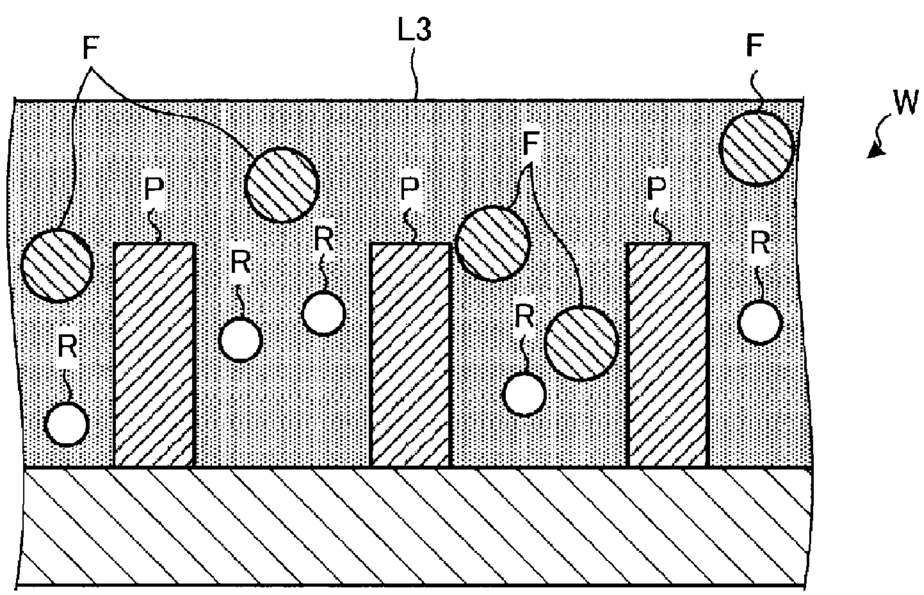
FIG. 1D is an explanatory view of the substrate cleaning method according to the first embodiment.
Figure 1E:
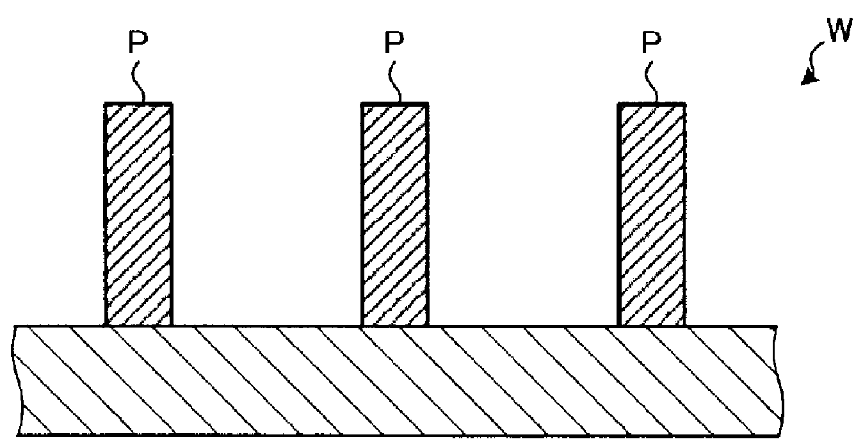
FIG. 1E is an explanatory view of the substrate cleaning method according to the first embodiment.

Subsequently, a dissolving treatment liquid L3 that dissolves the treatment film F is supplied to the treatment film F peeled off from the wafer W (see FIG. 1D). As a result, the treatment film F is dissolved so that the particles R captured in the treatment film F are in a floating state inside the dissolving treatment liquid L3. Then, by removing the dissolving treatment liquid L3 and the dissolved treatment film F from the wafer W, the particles R are removed from the wafer W (see FIG. 1E).

In this way, the substrate cleaning method according to the first embodiment peels off the treatment film F formed on the wafer W from the wafer W in the form of a "film", namely dissolving the treatment film F, to remove the particles R adhering to the pattern P and the like from the wafer W together with the treatment film F.

According to the substrate cleaning method according to the first embodiment, since particles are removed without using a chemical action, it is possible to prevent an underlying film from being eroded due to an etching action or the like.

Further, according to the substrate cleaning method according to the first embodiment, since the particles R can be removed with a force weaker than that in the conventional substrate cleaning method using a physical force, it is possible to prevent pattern collapse.

Further, according to the substrate cleaning method according to the first embodiment, it is possible to easily remove the particles R having a small particle diameter, which was difficult to remove by the conventional substrate cleaning method using a physical force.

Further, in the substrate cleaning method according to the first embodiment, the treatment film F is completely removed from the wafer W while bypassing pattern exposure after the film is formed on the wafer W. Therefore, the cleaned wafer W is in a state before the film-forming treatment liquid L1 is applied, that is, a state in which the pattern formation surface is exposed.

[Configuration of Substrate Cleaning System]

Figure 2:
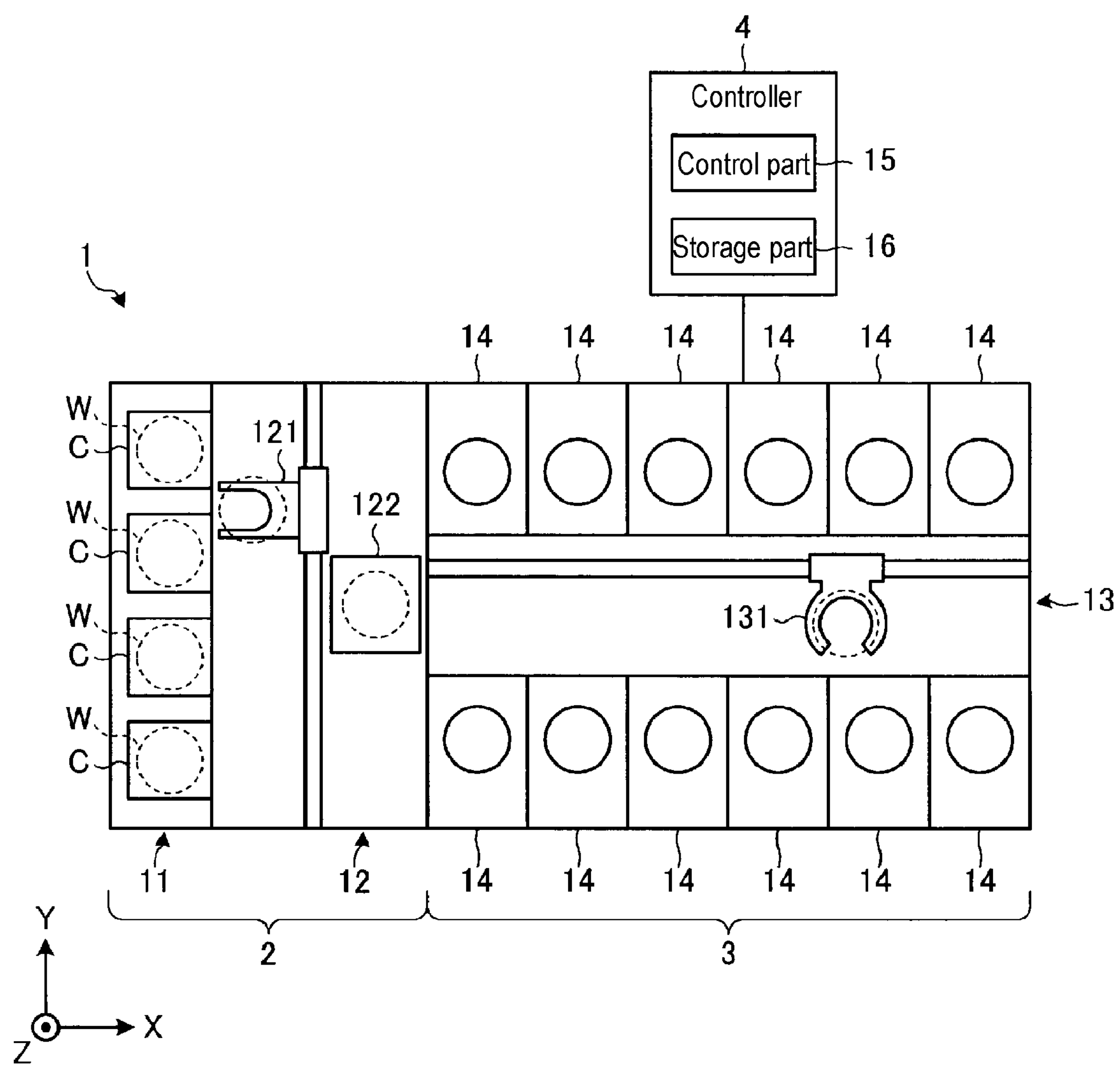
FIG. 2 is a schematic view illustrating a configuration of a substrate cleaning system according to the first embodiment.

Next, a configuration of a substrate cleaning system according to the first embodiment will be described with reference to FIG. 2. FIG. 2 is a schematic view illustrating the configuration of the substrate cleaning system according to the first embodiment. For the clarification of a positional relationship, an X-axis direction, a Y-axis direction and a Z-axis direction, which are orthogonal to one another, are defined in the following description and a positive Z-axis direction is defined as a vertical upward direction.

As illustrated in FIG. 2, the substrate cleaning system 1 includes a loading/unloading station 2 and a processing station 3. The loading/unloading station 2 and the processing station 3 are provided adjacent to each other.

The loading/unloading station 2 includes a carrier placement part 11 and a transfer part 12. A plurality of transfer containers (hereinafter referred to as "carriers C") capable of accommodating a plurality of wafers W in a horizontal posture are placed on the carrier placement part 11.

The transfer part 12 is provided adjacent to the carrier placement part 11. A substrate transfer device 121 and a delivery part 122 are provided inside the transfer part 12.

The substrate transfer device 121 includes a wafer holding mechanism for holding the wafer W. Further, the substrate transfer device 121 is capable of moving in the horizontal direction and the vertical direction and rotating around the vertical axis, and transfers the wafer W between the carrier C and the delivery part 122 by using the wafer holding mechanism.

The processing station 3 is provided adjacent to the transfer part 12. The processing station 3 includes a transfer part 13 and a plurality of substrate cleaning apparatuses 14. The plurality of substrate cleaning apparatuses 14 are provided to be arranged at both sides of the transfer part 13.

The transfer part 13 includes a substrate transfer device 131 provided therein. The substrate transfer device 131 includes a wafer holding mechanism for holding the wafer W. Further, the substrate transfer device 131 is capable of moving in the horizontal direction and the vertical direction and rotating around the vertical axis, and transfers the wafer W between the delivery part 122 and the substrate cleaning apparatuses 14 by using the wafer holding mechanism.

The substrate cleaning apparatus 14 is an apparatus configured to execute the substrate cleaning process based on the above-described substrate cleaning method. A specific configuration of the substrate cleaning apparatus 14 will be described later.

Further, the substrate cleaning system 1 includes a controller 4. The controller 4 is a device configured to control the operation of the substrate cleaning system 1. The controller 4 is, for example, a computer, and includes a control part 15 and a storage part 16. A program for controlling various processes such as the substrate cleaning process and the like are stored in the storage part 16. The control part 15 controls the operation of the substrate cleaning system 1 by reading and executing the program stored in the storage part 16.

The program may be recorded on a non-transitory computer-readable storage medium and may be installed on the storage part 16 of the controller 4 from the storage medium. Examples of the computer-readable storage medium may include a hard disk (HD), a flexible disk (FD), a compact disc (CD), a magneto-optical disk (MO), a memory card, and the like.

In the substrate cleaning system 1 configured as above, first, the substrate transfer device 121 of the loading/unloading station 2 takes out the wafer W from the carrier C and places the taken-out wafer W on the delivery part 122. The wafer W placed on the delivery part 122 is taken out from the delivery part 122 by the substrate transfer device 131 of the processing station 3, is loaded into the substrate cleaning apparatus 14 where the wafer W is subjected to the substrate cleaning process. The wafer W, which has been subjected to the substrate cleaning process, is unloaded from the substrate cleaning apparatus 14 by the substrate transfer device 131, is placed on the delivery part 122, and is then returned to the carrier C by the substrate transfer device 121.

[Configuration of Substrate Cleaning Apparatus]

Figure 3:
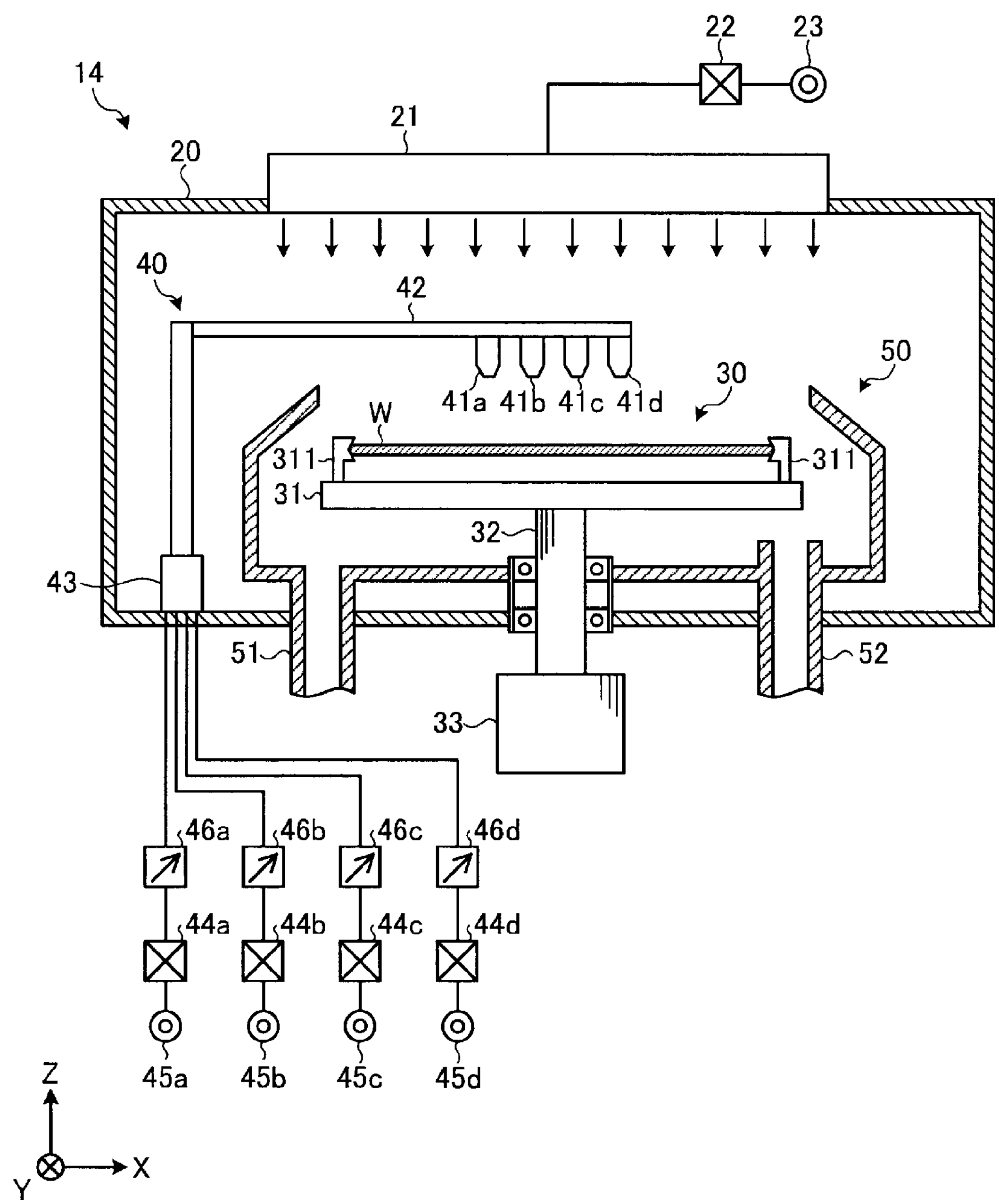
FIG. 3 is a schematic view illustrating the configuration of a substrate cleaning apparatus according to the first embodiment.

Next, the configuration of the substrate cleaning apparatus 14 will be described with reference to FIG. 3. FIG. 3 is a schematic view illustrating the configuration of the substrate cleaning apparatus 14 according to the first embodiment.

As illustrated in FIG. 3, the substrate cleaning apparatus 14 includes a chamber 20, a substrate holding mechanism 30, a liquid supply part 40, and a recovery cup 50.

The chamber 20 accommodates the substrate holding mechanism 30, the liquid supply part 40, and the recovery cup 50. An FFU (Fan Filter Unit) 21 is provided on a ceiling portion of the chamber 20. The FFU 21 forms a down-flow inside the chamber 20.

The FFU 21 is connected to a down-flow gas source 23 via a valve 22. The FFU 21 discharges a down-flow gas (for example, dry air), which is supplied from the down-flow gas source 23, into the chamber 20.

The substrate holding mechanism 30 includes a rotation holding part 31, a support pillar part 32, and a driving part 33. The rotation holding part 31 is provided substantially in the center of the chamber 20. A holding member 311 for holding the wafer W from the side surface is provided on an upper surface of the rotation holding part 31. The wafer W is horizontally held by the holding member 311 in a state in which the wafer W is slightly separated from the upper surface of the rotation holding part 31.

The support pillar part 32 is a member extending in the vertical direction. A base end portion of the support pillar part 32 is rotatably supported by the driving part 33. The rotation holding part 31 is horizontally supported at a leading end portion of the support pillar part 32. The driving part 33 rotates the support pillar part 32 around the vertical axis.

The substrate holding mechanism 30 rotates the rotation holding part 31 supported by the support pillar part 32 by rotating the support pillar part 32 using the driving part 33, thereby rotating the wafer W held by the rotation holding part 31.

The liquid supply part 40 supplies various types of liquids toward the wafer W held by the substrate holding mechanism 30. Specifically, the liquid supply part 40 supplies the film-forming treatment liquid L1, the peeling treatment liquid L2, the dissolving treatment liquid L3, and the hydrophobic liquid toward the wafer W.

The liquid supply part 40 includes a plurality of (four in this embodiment) nozzles 41*a* to 41*d*, an arm 42 configured to horizontally support the nozzles 41*a* to 41*d*, and a swiveling/elevating mechanism 43 configured to swivel and elevate the arm 42.

The nozzle 41*a* is connected to a film-forming treatment liquid source 45*a* via a valve 44*a* and a flow rate regulator 46*a*. The nozzle 41*b* is connected to a peeling treatment liquid source 45*b* via a valve 44*b* and a flow rate regulator 46*b*. The nozzle 41*c* is connected to a dissolving treatment liquid source 45*c* via a valve 44*c* and a flow rate regulator 46*c*. The nozzle 41*d* is connected to a hydrophobic liquid source 45*d* via a valve 44*d* and a flow rate regulator 46*d*.

The film-forming treatment liquid L1 supplied from the film-forming treatment liquid source 45*a* is discharged from the nozzle 41*a*. As the film-forming treatment liquid L1, for example, a top coating liquid, a "composition for substrate cleaning" disclosed in Japanese laid-open publication No. 2016-36012, or the like may be used. A top coating film (an example of the treatment film F) formed by the top coating liquid is a protective film coated on the upper surface of a resist in order to prevent an immersion liquid from penetrating into the resist. The immersion liquid is, for example, a liquid used for immersion exposure in a lithography process.

The peeling treatment liquid L2 supplied from the peeling treatment liquid source 45*b* is discharged from the nozzle 41*b*. The peeling treatment liquid L2 is, for example, pure water (deionized water, which is hereinafter referred to as "DIW").

The dissolving treatment liquid L3 supplied from the dissolving treatment liquid source 45*c* is discharged from the nozzle 41*c*. As the dissolving treatment liquid L3, for example, an organic solvent may be used. As the organic solvent, for example, IPA (isopropyl alcohol), thinner, MIBC (4-methyl-2-pentanol), toluene, acetic acid esters, alcohols, and the like may be used. Further, as the organic solvent, glycols (propylene glycol monomethyl ether), PGMEA (propylene glycol monomethyl ether acetate) to be described later, and the like may be used.

The hydrophobic liquid supplied from the hydrophobic liquid source 45*d* is discharged from the nozzle 41*d*. The hydrophobic liquid is a treatment liquid obtained by diluting a hydrophobic agent, which hydrophobizes the surface of the wafer W, with an organic solvent in a predetermined concentration. As the hydrophobic agent, for example, a silylating agent or a silane coupling agent may be used. Specifically, as the hydrophobic agent, TMSDMA (trimethyl silyldimethyl amine), DMSDMA (dimethyl silyldimethyl amine), TMSDEA (trimethyl silyldiethyl amine), and the like may be used. Further, as the hydrophobic agent, HMDS (hexamethyl disilazane), TMDS (1,1,3,3-tetramethyl disilazane), and the like may be used.

Further, as the organic solvent, an ethers solvent, an organic solvent belonging to ketone, or the like may be used. Specifically, as the organic solvent, PGMEA, cyclohexanone, HFE (hydrofluoroether), and the like may be used.

In this embodiment, the top coating liquid is used as the film-forming treatment liquid L1, the DIW is used as the peeling treatment liquid L2, and the IPA is used as the dissolving treatment liquid L3. Further, in this embodiment, the treatment liquid obtained by diluting TMSDMA with PGMEA is used as the hydrophobic liquid. Further, the IPA as the dissolving treatment liquid L3 is also used as a rinsing liquid supplied to the wafer W after the hydrophobic treatment.

The nozzle 41*a*, the valve 44*a*, the film-forming treatment liquid source 45*a*, and the flow rate regulator 46*a* are an example of a film-forming-liquid supply part. The nozzle 41*b*, the valve 44*b*, the peeling treatment liquid source 45*b*, and the flow rate regulator 46*b* are an example of a peeling treatment liquid supply part. The nozzle 41*c*, the valve 44*c*, the dissolving treatment liquid source 45*c*, and the flow rate regulator 46*c* are an example of a dissolving treatment liquid supply part. The nozzle 41*d*, the valve 44*d*, the hydrophobic liquid source 45*d*, and the flow rate regulator 46*d* are an example of a hydrophobic liquid supply part.

The recovery cup 50 is disposed so as to surround the rotation holding part 31 and collects a liquid scattered from the wafer W with the rotation of the rotation holding part 31. A liquid drainage port 51 is formed at the bottom of the recovery cup 50. The liquid collected by the recovery cup 50 is discharged from the liquid drainage port 51 to the outside of the substrate cleaning apparatus 14. Further, an exhaust port 52 is formed at the bottom of the recovery cup 50 to discharge the down-flow gas, which is supplied from the FFU 21, to the outside of the substrate cleaning apparatus 14.

[Specific Operation of Substrate Cleaning Apparatus]

Figure 4:
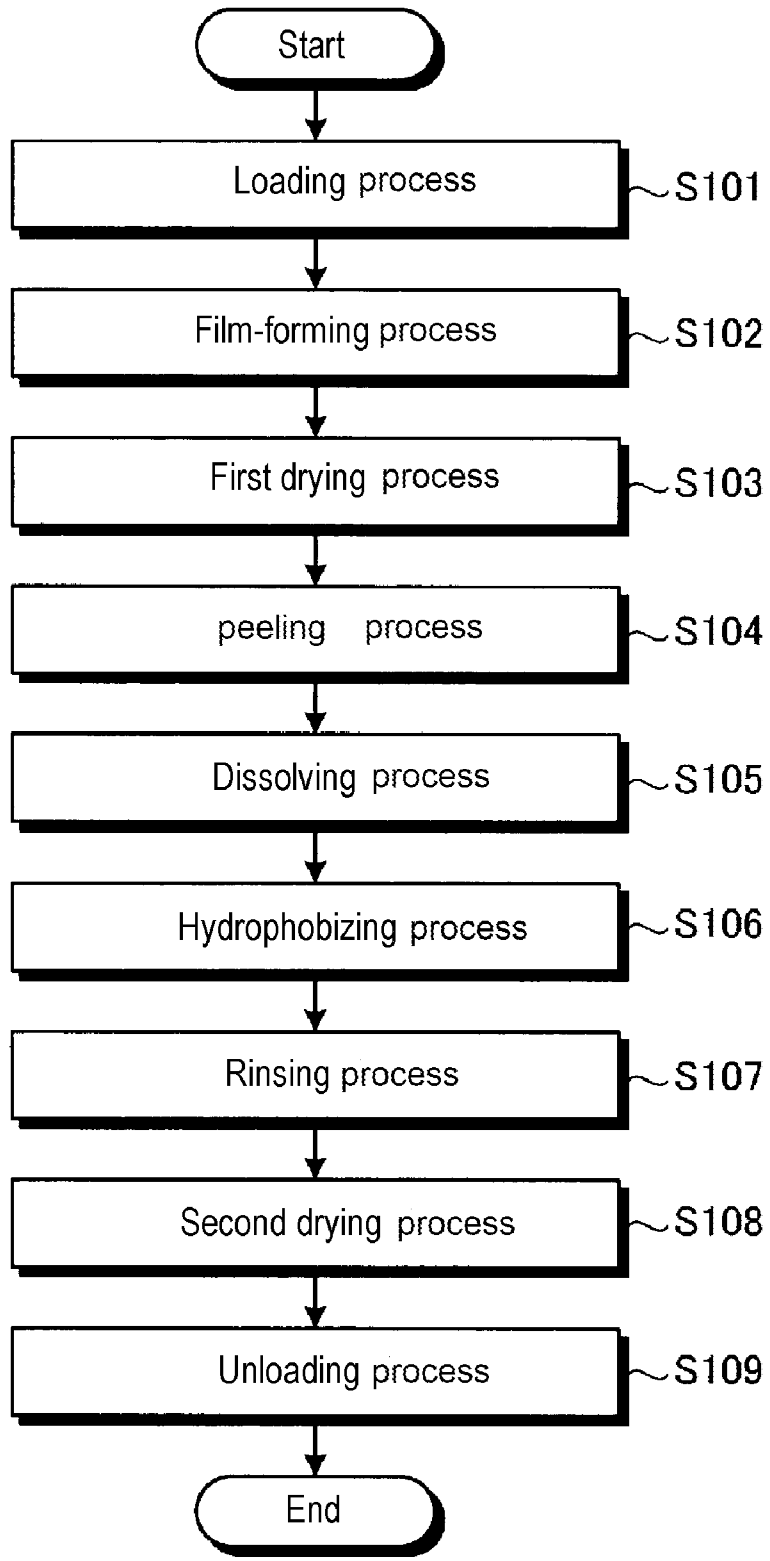
FIG. 4 is a flowchart showing a procedure of a substrate cleaning process according to the first embodiment.
Figure 5:
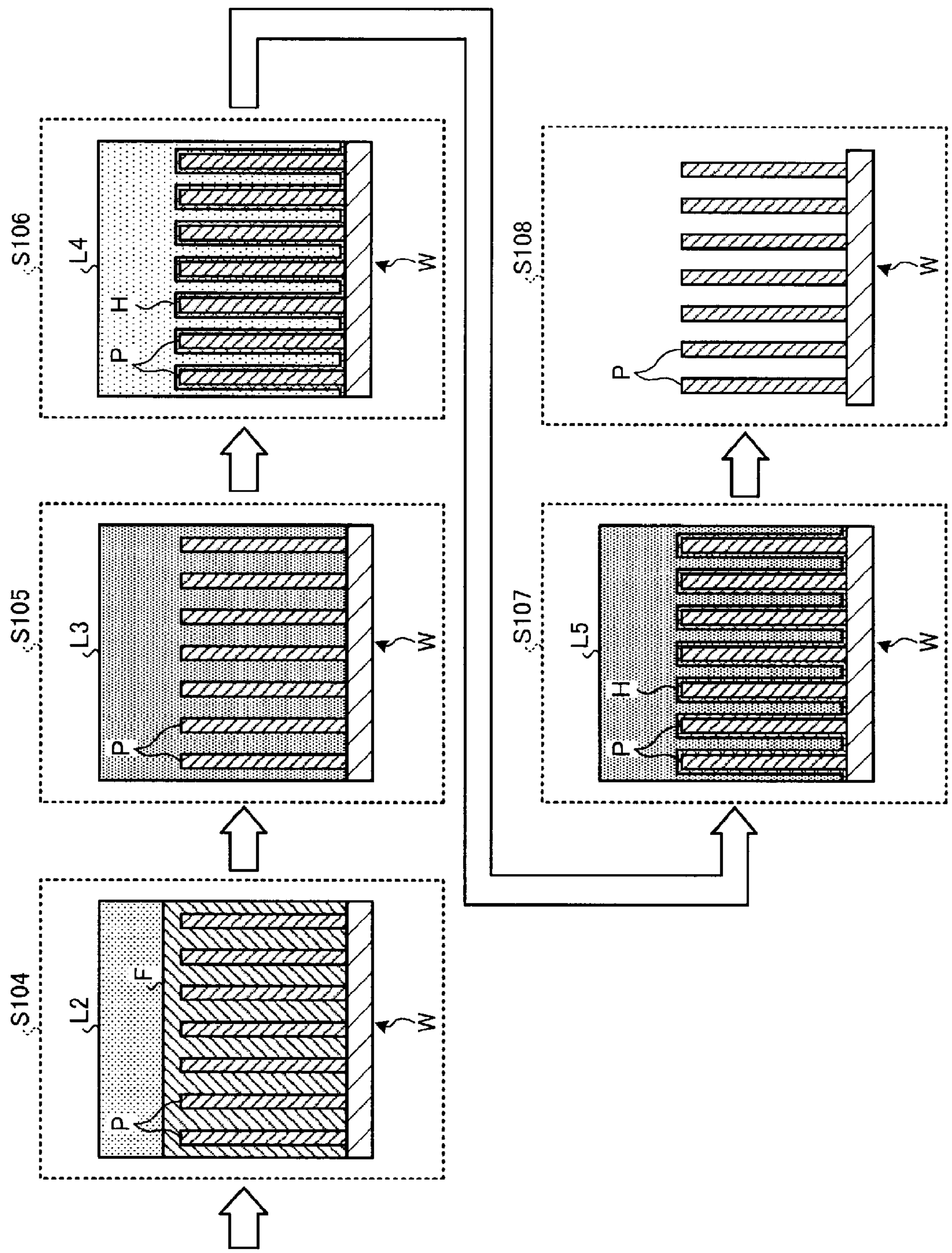
FIG. 5 is an explanatory view of the substrate cleaning process according to the first embodiment.

Next, a specific operation of the substrate cleaning apparatus 14 will be described with reference to FIGS. 4 and 5. FIG. 4 is a flowchart showing a procedure of the substrate cleaning process according to the first embodiment. FIG. 5 is an explanatory view of the substrate cleaning process according to the first embodiment. The processing procedure shown in FIG. 4 is executed under the control of the control part 15.

As shown in FIG. 4, a loading process is first performed in the substrate cleaning apparatus 14 (step S101). In the loading process, the wafer W loaded into the chamber 20 by the substrate transfer device 131 (see FIG. 2) is held by the holding member 311 of the substrate holding mechanism 30. At this time, the wafer W is held by the holding member 311 in a state in which the pattern formation surface is oriented upward. After that, the rotation holding part 31 is rotated by the driving part 33. As a result, the wafer W rotates together with the rotation holding part 31 while being horizontally held by the rotation holding part 31.

Subsequently, a film forming process is performed in the substrate cleaning apparatus 14 (step S102). The film forming process is an example of a film-forming treatment liquid supplying step of supplying, to the wafer W, the film-forming treatment liquid L1 containing a volatile component and serving to form a film on the wafer W.

In the film forming process, the film-forming treatment liquid L1 (the top coating liquid in this embodiment) is supplied to the pattern formation surface of the wafer W on which no resist is formed. The film-forming treatment liquid L1 is supplied to the wafer W without going through a resist.

The film-forming treatment liquid L1 supplied to the wafer W spreads on the surface of the wafer W by virtue of a centrifugal force accompanying the rotation of the wafer W. Then, the film-forming treatment liquid L1 solidifies or cures while causing volume shrinkage due to volatilization of the volatile component, so that a liquid film of the film-forming treatment liquid L1 is formed on the pattern formation surface of the wafer W.

The top coating liquid, which is the film-forming treatment liquid L1, contains an acrylic resin having a property of shrinking in volume when solidified or cured. As a result, not only the volatilization of the volatile component but also the curing shrinkage of the acrylic resin causes the volume shrinkage. Therefore, the volume shrinkage rate is larger than that of the film-forming treatment liquid containing only the volatile component, so that the particles R can be strongly separated. In particular, since the acrylic resin has a larger volume shrinkage rate than other resins such as epoxy resin and the like, the top coating liquid is effective in that it gives a tensile force to the particles R.

Subsequently, in the substrate cleaning apparatus 14, a first drying process is performed (step S103). In the first drying process, for example, the film-forming treatment liquid L1 is dried by increasing the rotation speed of the wafer W for a predetermined time. As a result, the volatilization of the volatile component contained in the film-forming treatment liquid L1 is promoted so that the film-forming treatment liquid L1 solidifies or cures to form the treatment film F (the top coating film in this embodiment) on the pattern formation surface of the wafer W.

The first drying process in step S103 may be, for example, a process of depressurizing the interior of the chamber 20 by a depressurization device (not shown), or a process of lowering an internal humidity of the chamber 20 by the down-flow gas supplied from the FFU 21. These processes can also promote the volatilization of the volatile component.

Further, although an example of promoting the volatilization of the volatile component has been illustrated in the above, the wafer W may be allowed to stand by in the substrate cleaning apparatus 14 until the top coating liquid naturally solidifies or cures. Further, the volatilization of the volatile component may be promoted by stopping the rotation of the wafer W or rotating the wafer W at such a rotation speed that the surface of the wafer W is not exposed by dropping of the film-forming treatment liquid L1.

Subsequently, a peeling-off process is performed in the substrate cleaning apparatus 14 (step S104). The peeling-off process is an example of a peeling treatment liquid supplying step of supplying the peeling treatment liquid L2 for peeling off, from the wafer W, the treatment film F formed by solidifying or curing of the film-forming treatment liquid L1 on the wafer W due to the volatilization of the volatile component.

In the peeling-off process, the peeling treatment liquid L2 (DIW in this embodiment) is supplied to the treatment film F formed on the wafer W. The peeling treatment liquid L2 supplied to the treatment film F spreads on the treatment film F by virtue of the centrifugal force accompanying the rotation of the wafer W (see FIG. 5).

The peeling treatment liquid L2 permeates into the treatment film F, reaches the pattern formation surface which is an interface of the wafer W, and then permeates into the pattern formation surface to peel off the treatment film F from the wafer W. As a result, the particles R adhering to the pattern formation surface of the wafer W are peeled off from the wafer W together with the treatment film F.

Subsequently, a dissolving process is performed in the substrate cleaning apparatus 14 (step S105). The dissolving process is an example of a dissolving treatment liquid supplying step of supplying the dissolving treatment liquid L3 for dissolving the treatment film F to the wafer W after the peeling-off process and before a hydrophobizing process.

In the dissolving process, the dissolving treatment liquid L3 (IPA in this embodiment) is supplied to the treatment film F peeled off from the wafer W. The dissolving treatment liquid L3 supplied to the treatment film F spreads on the treatment film F by virtue of the centrifugal force accompanying the rotation of the wafer W. As a result, the treatment film F is dissolved (see FIG. 5). Further, the particles R floating in the dissolved treatment film F and the dissolving treatment liquid L3 are removed from the wafer W together with the dissolving treatment liquid L3.

Subsequently, the hydrophobizing process is performed in the substrate cleaning apparatus 14 (step S106). The hydrophobizing process is an example of a hydrophobic liquid supplying step of supplying a hydrophobic liquid L4 for hydrophobizing the wafer W to the wafer W after the peeling treatment liquid L2 is supplied.

In the hydrophobizing process, the hydrophobic liquid L4 (a mixed liquid of TMSDMA and PGMEA in this embodiment) is supplied to the wafer W after the dissolving process. As a result, a hydrophobic film H is formed on the pattern P on the wafer W and the pattern formation surface of the wafer W (see FIG. 5).

Subsequently, a rinsing process is performed in the substrate cleaning apparatus 14 (step S107). The rinsing process is an example of a rinse liquid supplying step of supplying a rinse liquid L5 to the substrate after the hydrophobic liquid supplying step.

In the rinsing process, the rinse liquid L5 (in this embodiment, IPA which is also the dissolving treatment liquid L3) is supplied to the wafer W on which the hydrophobic film H is formed. The rinse liquid L5 supplied to the wafer W spreads on the pattern formation surface of the wafer W by virtue of the centrifugal force accompanying the rotation of the wafer W. As a result, the hydrophobic liquid L4 remaining on the wafer W is replaced with the rinse liquid L5 (see FIG. 5).

Subsequently, a second drying process is performed in the substrate cleaning apparatus 14 (step S108). The second drying process is an example of a drying step of removing the rinse liquid L5 from the wafer W after the rinsing process.

In the second drying process, the wafer W is dried by, for example, increasing the rotation speed of the wafer W for a predetermined time and dropping off the rinse liquid L5 remaining on the wafer W (see FIG. 5). After that, the rotation of the wafer W is stopped.

Subsequently, an unloading process is performed in the substrate cleaning apparatus 14 (step S109). In the unloading process, the wafer W is taken out from the chamber 20 of the substrate cleaning apparatus 14 by the substrate transfer device 131 (see FIG. 2). After that, the wafer W is accommodated in the carrier C placed on the carrier placement part 11 via the delivery part 122 and the substrate transfer device 121. When the substrate unloading process is completed, the substrate cleaning process for one sheet of wafer W is completed.

As described above, in the substrate cleaning apparatus 14 according to the first embodiment, the wafer W is hydrophobized by the hydrophobizing process. As a result, the pattern P is less likely to receive the surface tension of the rinse liquid L5. Therefore, according to the substrate cleaning apparatus 14 according to the first embodiment, it is possible to prevent the collapse of the pattern P due to the surface tension of the rinse liquid L5 during the second drying process.

Meanwhile, similarly to the dissolving treatment liquid L3 (IPA in this embodiment), the organic solvent (PGMEA in this embodiment) contained in the hydrophobic liquid L4 has a property of dissolving the treatment film F. Therefore, the dissolving process (step S105) may be omitted in the substrate cleaning apparatus 14. That is, by supplying the hydrophobic liquid L4 to the wafer W after the peeling-off process, the treatment film F can be dissolved and the wafer W can also be hydrophobized without using the dissolving treatment liquid L3.

Second Embodiment

Figure 6:
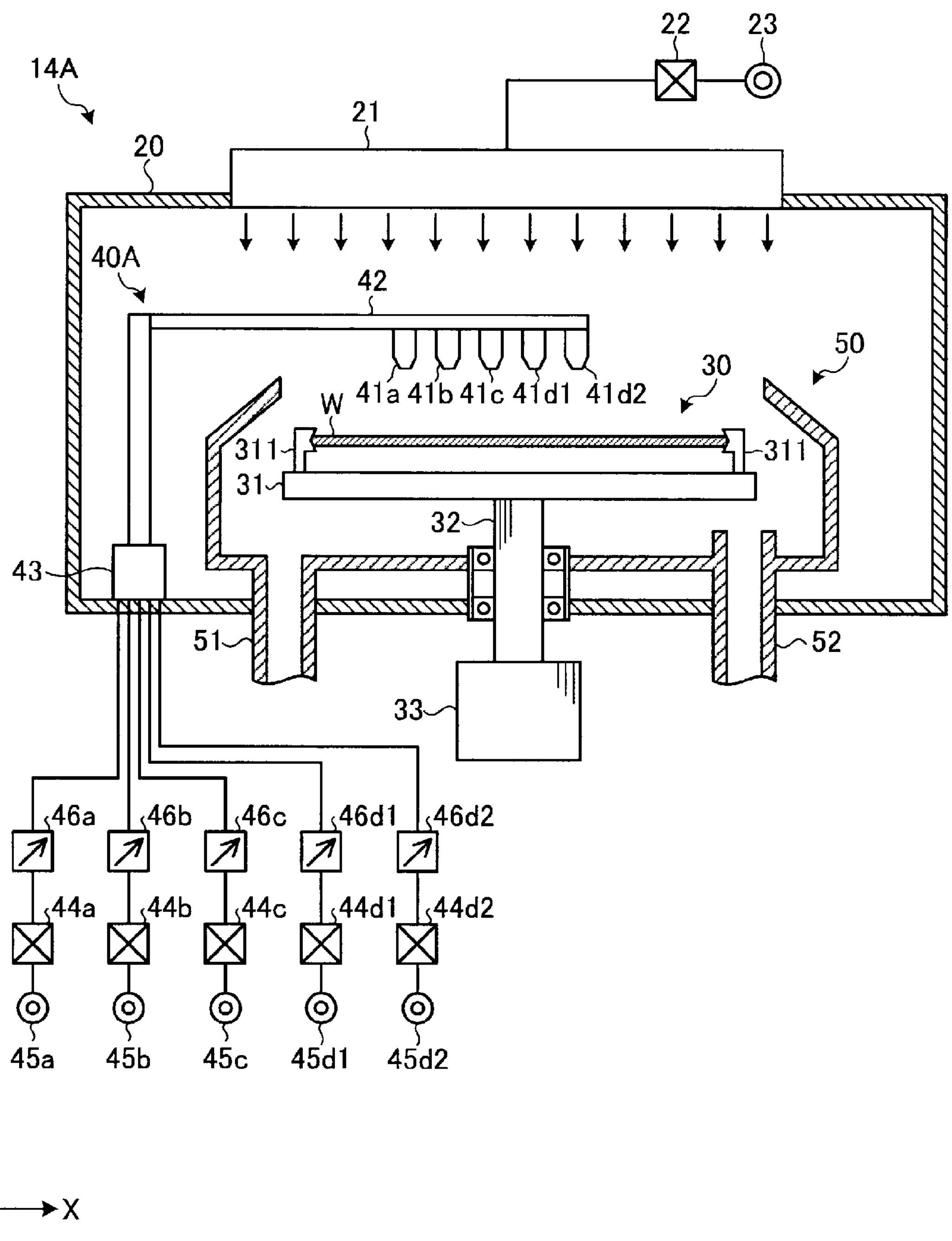
FIG. 6 is a schematic view illustrating a configuration of a substrate cleaning apparatus according to a second embodiment.

Next, a substrate cleaning apparatus according to a second embodiment will be described. FIG. 6 is a schematic view illustrating a configuration of the substrate cleaning apparatus according to the second embodiment.

In the above-described first embodiment, the example in which the substrate cleaning apparatus 14 includes the hydrophobic liquid source 45*d* and the hydrophobic liquid L4 supplied from the hydrophobic liquid source 45*d* is discharged from the nozzle 41*d* to the wafer W has been described. That is, in the first embodiment, the hydrophobic liquid in which the hydrophobic agent and the organic solvent are mixed in advance is supplied to the wafer W. However, the present disclosure is limited thereto. A substrate cleaning apparatus 14A may supply the hydrophobic agent and the organic solvent to the wafer W in a separate manner so that they are mixed with each other on the wafer W to generate the hydrophobic liquid on the wafer W.

As illustrated in FIG. 6, the substrate cleaning apparatus 14A according to the second embodiment includes a liquid supply part 40A. The liquid supply part 40A includes a nozzle 41*d*1 configured to discharge a hydrophobic agent and a nozzle 41*d*2 configured to discharge an organic solvent, in addition to the nozzle 41*a* configured to discharge the film-forming treatment liquid L1, the nozzle 41*b* configured to discharge the peeling treatment liquid L2, and the nozzle 41*c* configured to discharge the dissolving treatment liquid L3.

The nozzle 41*d*1 is connected to a hydrophobic agent source 45*d*1 via a valve 44*d*1 and a flow rate regulator 46*d*1. The hydrophobic agent (TMSDMA in this embodiment) supplied from the hydrophobic agent source 45*d*1 is discharged from the nozzle 41*d*1.

The nozzle 41*d*2 is connected to an organic solvent source 45*d*2 via a valve 44*d*2 and a flow rate regulator 46*d*2. The organic solvent (PGMEA in this embodiment) supplied from the organic solvent source 45*d*2 is discharged from the nozzle 41*d*2.

The liquid supply part 40A may include a first arm configured to support the nozzle 41*d*1 and a first swiveling/elevating mechanism configured to swivel and elevate the first arm, and a second arm configured to support the nozzle 41*d*2 and a second swiveling/elevating mechanism configured to swivel and elevate the second arm.

Figure 7:
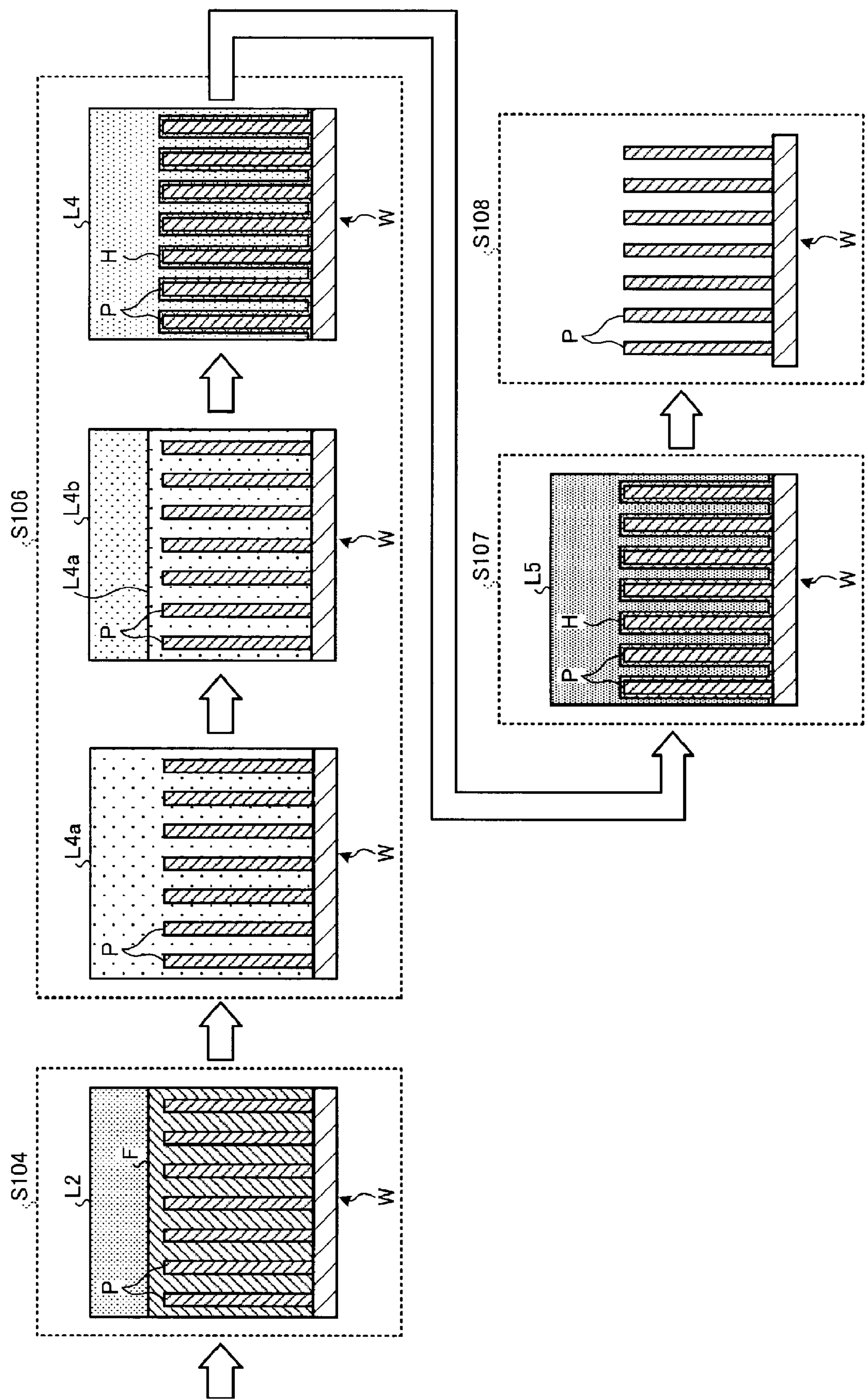
FIG. 7 is an explanatory view of a substrate cleaning process according to the second embodiment.

Next, a specific operation of the substrate cleaning apparatus 14A according to the second embodiment will be described with reference to FIG. 7. FIG. 7 is an explanatory view of a substrate cleaning process according to the second embodiment.

As illustrated in FIG. 7, in the substrate cleaning apparatus 14A according to the second embodiment, in the hydrophobizing process in step S106, an organic solvent L4*a* is first supplied to the wafer W after the peeling-off process in step S104. The organic solvent L4*a* supplied on the wafer W spreads on the wafer W by virtue of a centrifugal force accompanying the rotation of the wafer W. As a result, the treatment film F is dissolved by the organic solvent L4*a*, and the dissolved treatment film F and the particles R floating in the organic solvent L4*a* are removed from the wafer W together with the organic solvent L4*a*. In this way, the organic solvent L4*a* (PGMEA in this embodiment) contained in the hydrophobic liquid L4 can also function as the dissolving treatment liquid L3 that dissolves the treatment film F.

Subsequently, in the substrate cleaning apparatus 14A, a hydrophobic agent L4*b* is supplied to the wafer W in which the organic solvent L4*a* remains. The hydrophobic agent L4*b* supplied to the wafer W is mixed with the organic solvent L4*a* remaining on the wafer W. As a result, the hydrophobic liquid L4 is generated on the wafer W. The hydrophobic liquid L4 spreads on the wafer W by virtue of the centrifugal force accompanying the rotation of the wafer W. As a result, the hydrophobic film H is formed on the pattern P on the wafer W and the pattern formation surface of the wafer W.

After that, in the substrate cleaning apparatus 14A, the wafer W is subjected to the rinsing process (step S107) and the drying process (step S108).

In this embodiment, in the hydrophobizing process in step S106, after supplying the organic solvent L4*a* to the wafer W, the treatment liquid is switched to the hydrophobic agent L4*b*, and the hydrophobic agent L4*b* is supplied to the wafer W. The present disclosure is limited thereto. After supplying the organic solvent L4*a* to the wafer W, the hydrophobic agent L4*b* may be supplied to the wafer W while the organic solvent L4*a* is supplied to the wafer W. Alternatively, the organic solvent L4*a* and the hydrophobic agent L4*b* may be supplied to the wafer W at the same time.

Further, the substrate cleaning apparatus 14A according to the second embodiment may supply the organic solvent L4*a* (PGMEA in this embodiment) as the rinse liquid L5 in the rinsing process of step S107. As a result, the supply system of the rinse liquid L5 (IPA in this embodiment) may be omitted.

Further, the substrate cleaning apparatus 14A according to the second embodiment may perform a dissolving process. In this case, by supplying the organic solvent L4*a* (in this embodiment, PGMEA) as the dissolving treatment liquid L3, the supply system of the dissolving treatment liquid L3 (in this embodiment, IPA) may be omitted.

Third Embodiment

Figure 8:
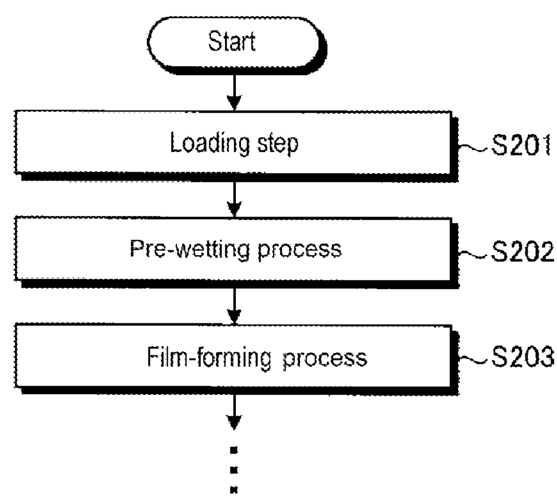
FIG. 8 is a flowchart showing a procedure of a substrate cleaning process according to a third embodiment.

Next, a substrate cleaning process according to a third embodiment will be described with reference to FIG. 8. FIG. 8 is a flowchart showing a procedure of the substrate cleaning process according to the third embodiment. For example, a processing procedure after a film forming process (step S203) shown in FIG. 8 is the same as the processing procedure of steps S103 to S109 shown in FIG. 4. Alternatively, the processing procedure of the third embodiment may be the same as the processing procedure in which the dissolving process (step S105) is excluded from steps S103 to S109 shown in FIG. 4.

The substrate cleaning apparatus 14 according to the first embodiment or the substrate cleaning apparatus 14A according to the second embodiment may perform a pre-wetting process (step S202) after the loading process in step S201 and before the film forming process in step S203, as illustrated in FIG. 8.

In the pre-wetting process, a pre-wetting liquid is supplied to the wafer W before the film forming process. The pre-wetting liquid spreads on the wafer W by virtue of the centrifugal force accompanying the rotation of the wafer W.

The pre-wetting liquid is a solvent having an affinity with the film-forming treatment liquid L1 (in this embodiment, the top coating liquid). An example of the pre-wetting liquid may include MIBC (4-methyl-2-pentanol). MIBC is contained in the top coating liquid and has an affinity with the top coating liquid. In addition, examples of the pre-wetting liquid may include PGME (propylene glycol monomethyl ether), PGMEA, and the like.

In this way, by applying the pre-wetting liquid having an affinity with the film-forming treatment liquid L1 on the wafer W in advance, the film-forming treatment liquid L1 can easily spread on the wafer W in the film forming process and can also easily enter a gap between the patterns P. Therefore, it is possible to reduce the amount of the film-forming treatment liquid L1 used, and it is possible to more reliably remove the particles R that have entered the gap between the patterns P. In addition, the time required for the film forming process can be shortened.

Further, by using, as the pre-wetting liquid, the same solvent (in this embodiment, PGMEA) as the organic solvent L4*a* contained in the hydrophobic liquid L4, the pre-wetting process can be performed without separately providing a supply system of the pre-wetting liquid.

Other Embodiments

In the substrate cleaning methods according to the first to third embodiments described above, prior to supplying DIW as the peeling treatment liquid L2, a mixed liquid obtained by mixing DIW and a liquid having the surface tension smaller than that of DIW may be supplied to the treatment film F.

Since the surface tension of such a mixed solution is smaller than that of DIW, the mixed solution is hardly repelled from the surface of the treatment film F and easily permeates into the treatment film F. By permeating the mixed solution into the treatment film F, a path for DIW can be formed in the treatment film F. As a result, when DIW as the peeling treatment liquid L2 is subsequently supplied to the treatment film F, the DIW can reach the pattern formation surface at an early stage. Therefore, the peeling of the treatment film F from the wafer W can be promoted.

In this embodiment, the organic solvent L4*a* (in this embodiment, PGMEA) contained in the hydrophobic liquid L4 may be used as the "liquid having the surface tension smaller than that of DIW". As a result, the peeling of the treatment film F from the wafer W can be promoted without adding a new supply system separately. The "liquid having the surface tension smaller than that of DIW" is not limited to PGMEA, but may be, for example, IPA or the like.

In each of the above-described embodiments, the example in which the dissolving treatment liquid L3 is an organic solvent has been described, but the dissolving treatment liquid L3 is not limited to an organic solvent such as IPA. For example, the dissolving treatment liquid may be an alkaline developer or an acidic developer. The alkaline developer may include at least one of aqueous ammonia, a quaternary ammonium hydroxide aqueous solution such as Tetra Methyl Ammonium Hydroxide (TMAH), and a choline aqueous solution.

When an alkaline developer is used as the dissolving treatment liquid L3, a zeta potential having the same polarity can be generated in the wafer W and the particles R. As a result, the wafer W and the particles R repel each other, so that the particles R can be prevented from re-adhering to the wafer W. Further, as the acidic developer, for example, acetic acid, formic acid, hydroxyacetic acid, or the like may be used.

In each of the above-described embodiments, the example in which the peeling treatment liquid L2 is DIW has been described, but the peeling treatment liquid L2 is not limited to DIW. For example, an alkaline developer having a concentration lower than that of the alkaline developer used as the dissolving treatment liquid L3 may be used as the peeling treatment liquid L2.

As described above, the substrate cleaning methods according to the embodiments include the film-forming treatment liquid supplying step (for example, the film forming process), the peeling treatment liquid supplying step (for example, the peeling-off process), and the hydrophobic liquid supplying step (for example, the hydrophobizing process). In the film-forming treatment liquid supplying step, the film-forming treatment liquid L1 containing a volatile component and serving to form a film on the substrate (for example, the wafer W) is supplied to the substrate. In the peeling treatment liquid supplying step, the peeling treatment liquid L2 for peeling the treatment film F from the substrate is supplied to the treatment film F formed by solidifying or curing the film-forming treatment liquid L1 on the substrate due to the volatilization of the volatile component. In the hydrophobic liquid supplying step, the hydrophobic liquid L4 for hydrophobizing the substrate s supplied to the substrate after the peeling treatment liquid L2 is supplied.

By hydrophobizing the wafer W, the pattern P is less likely to receive the surface tension from the liquid, so that pattern collapse during the drying process of the substrate can be suppressed.

The substrate cleaning methods according to the embodiments may further include the rinse liquid supplying step (for example, the rinsing process) and the drying process (for example, the second drying process). In the rinse liquid supplying step, the rinse liquid L5 is supplied to the substrate after the hydrophobic liquid supplying step. In the drying process, the rinse liquid L5 is removed from the substrate after the rinse liquid supplying step.

By hydrophobizing the substrate in the hydrophobic liquid supplying step, the pattern P is less likely to receive the surface tension of the rinse liquid L5. Therefore, during the drying process, the collapse of the pattern P due to the surface tension of the rinse liquid L5 can be suppressed.

The hydrophobic liquid L4 may contain the hydrophobic agent L4*b* for hydrophobizing the substrate, and the organic solvent L4*a*. In this case, the rinse liquid L5 may be the organic solvent L4*a*. As described above, the supply system can be simplified by using the common organic solvent L4*a* in the hydrophobic liquid supplying step and the rinse liquid supplying step.

The hydrophobic liquid L4 may contain the hydrophobic agent L4*b* for hydrophobizing the substrate and the organic solvent L4*a*. In this case, in the hydrophobic liquid supplying step, the organic solvent L4*a* may be supplied to the substrate after the peeling treatment liquid L2 is supplied, and then the hydrophobic agent L4*b* may be supplied to the substrate on which the organic solvent L4*a* remains.

As a result, the substrate can be hydrophobized by dissolving the treatment film F by the organic solvent L4*a* and allowing the subsequently-supplied hydrophobic agent L4*b* to be mixed with the organic solvent L4*a* on the substrate to generate the hydrophobic liquid L4.

The substrate cleaning methods according to the embodiments may further include the dissolving treatment liquid supplying step. In the dissolving treatment liquid supplying step, the dissolving treatment liquid L3 for dissolving the treatment film F is supplied to the substrate after the peeling treatment liquid supplying step and before the hydrophobic liquid supplying step. As a result, after the treatment film F is dissolved, the particles R floating in the dissolved treatment film F and the dissolving treatment liquid L3 can be removed from the wafer W together with the dissolving treatment liquid L3.

The hydrophobic liquid L4 may contain the hydrophobic agent L4*b* for hydrophobizing the substrate, and the organic solvent L4*a*. In this case, the dissolving treatment liquid L3 may be the organic solvent L4*a*. As described above, the supply system can be simplified by using the common organic solvent L4*a* in the hydrophobic liquid supplying step and the dissolving treatment liquid supplying step.

The hydrophobic liquid L4 may contain the hydrophobic agent L4*b* for hydrophobizing the substrate, and the organic solvent L4*a*. In this case, the substrate cleaning methods according to the embodiments may further include the pre-wetting process of supplying the organic solvent L4*a* to the substrate before the film-forming treatment liquid supplying step.

By performing the pre-wetting process, in the film-forming treatment liquid supplying step, the film-forming treatment liquid L1 easily spreads on the substrate and easily enters a gap between the patterns P. Therefore, it is possible to reduce the amount of the film-forming treatment liquid L1 used, and it is possible to more reliably remove the particles R that have entered the gap between the patterns P. In addition, the time required for the film-forming treatment liquid supplying step can be shortened. Further, the supply system can be simplified by using the common organic solvent L4*a* in the hydrophobic liquid supplying step and the pre-wetting step.

It should be noted that the embodiments disclosed herein are exemplary in all respects and are not restrictive. The above-described embodiments may be omitted, replaced or modified in various forms without departing from the scope and spirit of the appended claims.

EXPLANATION OF REFERENCE NUMERALS

W: wafer, P: pattern, R: particles, 1: substrate cleaning system, 4: controller, 14: substrate cleaning apparatus, 20: chamber, 21: FFU, 30: substrate holding mechanism, 40: liquid supply part, 45*a*: film-forming treatment liquid source, 45*b*: peeling treatment liquid source, 45*c*: dissolving treatment liquid source, 45*d*: hydrophobic liquid source, 50: recovery cup

What is claimed is:

1. A substrate cleaning method comprising:

supplying a film-forming treatment liquid containing a volatile component to a substrate to form a treatment film on the substrate;

supplying a peeling treatment liquid, which peels off the treatment film from the substrate, to the treatment film formed by solidifying or curing the film-forming treatment liquid on the substrate due to volatilization of the volatile component;

supplying a hydrophobic liquid, which hydrophobizes the substrate, to the substrate to which the peeling treatment liquid has been supplied;

supplying a rinse liquid to the substrate after the supplying the hydrophobic liquid; and removing the rinse liquid from the substrate after the supplying the rinse liquid, wherein the hydrophobic liquid contains a hydrophobic agent that hydrophobizes the substrate, and an organic solvent, and wherein the rinse liquid is the organic solvent.

2. The substrate cleaning method of claim 1, wherein the supplying the hydrophobic liquid includes supplying the organic solvent to the substrate to which the peeling treatment liquid has been supplied, and subsequently supplying the hydrophobic agent to the substrate on which the organic solvent remains.

3. The substrate cleaning method of claim 1, further comprising: supplying a dissolving treatment liquid for dissolving the treatment film to the substrate after the supplying the peeling treatment liquid and before the supplying the hydrophobic liquid.

4. The substrate cleaning method of claim 1, further comprising: supplying, in a pre-wetting process, an organic solvent to the substrate before the supplying the film-forming treatment liquid.

5. The substrate cleaning method of claim 1, wherein the supplying the film-forming treatment liquid includes supplying to the substrate on which no resist is formed the film-forming treatment liquid containing the volatile component to form the treatment film on the substrate, and wherein the supplying the peeling treatment liquid includes peeling off the treatment film from the substrate, without being dissolved, by supplying the peeling treatment liquid to the treatment film.

6. The substrate cleaning method of claim 1, wherein the peeling treatment liquid is pure water.

7. The substrate cleaning method of claim 3, wherein the dissolving treatment liquid is the organic solvent.

8. A non-transitory computer-readable storage medium storing a program that operates on a computer and controls a substrate cleaning system, wherein, when executed, the program causing the computer to control the substrate cleaning system to perform the substrate cleaning method of claim 1.

* * * * *